(12) United States Patent
Brewer et al.

(10) Patent No.: US 7,715,194 B2
(45) Date of Patent: May 11, 2010

(54) METHODOLOGY OF COOLING MULTIPLE HEAT SOURCES IN A PERSONAL COMPUTER THROUGH THE USE OF MULTIPLE FLUID-BASED HEAT EXCHANGING LOOPS COUPLED VIA MODULAR BUS-TYPE HEAT EXCHANGERS

(75) Inventors: Richard Grant Brewer, Foster City, CA (US); Norman Chow, Milpitas, CA (US); James Hom, Redwood City, CA (US)

(73) Assignee: Cooligy Inc., Mountain View, CA (US)

( * ) Notice: Subject to any disclaimer, the term of this patent is extended or adjusted under 35 U.S.C. 154(b) by 448 days.

(21) Appl. No.: 11/784,298

(22) Filed: Apr. 6, 2007

(65) Prior Publication Data

US 2007/0235167 A1 Oct. 11, 2007

Related U.S. Application Data

(60) Provisional application No. 60/791,242, filed on Apr. 11, 2006.

(51) Int. Cl.
*H05K 7/20* (2006.01)
(52) U.S. Cl. ............. 361/699; 361/679.47; 361/679.54; 257/706; 165/80.3; 62/113
(58) Field of Classification Search ............ 361/679.47, 361/679.49, 679.54, 699, 700, 704, 726
See application file for complete search history.

(56) References Cited

U.S. PATENT DOCUMENTS 596,062 A 12/1897 Firey (Continued)

FOREIGN PATENT DOCUMENTS

EP 1003006 A1 5/2000

(Continued)

OTHER PUBLICATIONS

Yongendra Joshi, "Heat out of small packages", Dec. 2001, Mechanical Engineer, pp. 56-58.

(Continued)

*Primary Examiner*—Jayprakash N Gandhi
*Assistant Examiner*—Courtney Smith
(74) *Attorney, Agent, or Firm*—Haverstock & Owens LLP

(57) ABSTRACT

A cooling system is used to cool heat generating devices within a personal computer. The cooling system has a first fluid loop and an expandable array of one or more second fluid loops. For each of the second fluid loops, heat generating devices transfer heat to fluid flowing through corresponding heat exchanging devices in the loop. Heat is transferred from the fluid in each second fluid loop to a thermal bus of the first fluid loop via a thermal interface. The second fluid loop can be a pumped fluid loop or can include a heat pipe. Within the first fluid loop, a fluid is continuously pumped from the thermal bus to a fluid-to-air heat exchanging system and back to the thermal bus. Heat transferred to the thermal bus from the first fluid loop is transferred to the fluid in the second fluid loop passing through the thermal bus. The heated fluid is pumped through the fluid-to-air heat exchanging system where the heat is transferred from the fluid to the ambient. The thermal bus provides a modular, scalable cooling system which allows for the expansion of cooling capacity without breaking the fluid lines.

55 Claims, 3 Drawing Sheets

U.S. PATENT DOCUMENTS

| | | | |
|---|---|---|---|
| 2,039,593 A | 5/1936 | Hubbuch et al. ............. 257/256 |
| 2,273,505 A | 2/1942 | Florian ......................... 138/28 |
| 3,361,195 A | 1/1968 | Meyerhoff et al. ............ 165/80 |
| 3,524,497 A | 8/1970 | Chu et al. ..................... 165/80 |
| 3,654,988 A | 4/1972 | Clayton, III .................. 165/17 |
| 3,771,219 A | 11/1973 | Tuzi et al. ..................... 29/583 |
| 3,800,510 A | 4/1974 | Lamond |
| 3,817,321 A | 6/1974 | von Cube et al. ............ 165/105 |
| 3,823,572 A | 7/1974 | Cochran, Jr. .................. 62/160 |
| 3,852,806 A | 12/1974 | Corman et al. ................. 357/82 |
| 3,923,426 A | 12/1975 | Theeuwes .................... 417/48 |
| 3,929,154 A | 12/1975 | Goodwin ...................... 137/344 |
| 3,946,276 A | 3/1976 | Braun et al. ................. 317/100 |
| 3,948,316 A | 4/1976 | Souriau ........................ 165/105 |
| 3,993,123 A | 11/1976 | Chu et al. ..................... 165/80 |
| 4,109,707 A | 8/1978 | Wilson et al. ................. 165/46 |
| 4,194,559 A | 3/1980 | Eastman ....................... 165/105 |
| 4,203,488 A | 5/1980 | Johnson et al. ............ 165/80 B |
| 4,211,208 A | 7/1980 | Lindner ....................... 126/400 |
| 4,235,285 A | 11/1980 | Johnson et al. ............ 165/80 B |
| 4,248,295 A | 2/1981 | Ernst et al. ................... 165/105 |
| 4,273,082 A | 6/1981 | Tholen ...................... 123/41.31 |
| 4,312,012 A | 1/1982 | Frieser et al. ................. 357/82 |
| 4,345,267 A | 8/1982 | Corman et al. ................. 357/81 |
| 4,409,079 A | 10/1983 | Miyazaki et al. |
| 4,450,472 A | 5/1984 | Tuckerman et al. ............ 357/82 |
| 4,467,861 A | 8/1984 | Kiseev et al. ............ 165/104.22 |
| 4,485,429 A | 11/1984 | Mittal ........................... 361/386 |
| 4,494,171 A | 1/1985 | Bland et al. ................. 361/386 |
| 4,497,875 A | 2/1985 | Arakawa et al. |
| 4,516,632 A | 5/1985 | Swift et al. ................. 165/167 |
| 4,540,115 A | 9/1985 | Hawrylo ...................... 228/123 |
| 4,561,040 A | 12/1985 | Eastman et al. ............. 361/385 |
| 4,567,505 A | 1/1986 | Pease et al. ..................... 357/82 |
| 4,568,431 A | 2/1986 | Polan et al. .................... 204/13 |
| 4,573,067 A | 2/1986 | Tuckerman et al. ............ 357/82 |
| 4,574,876 A | 3/1986 | Aid ............................. 165/46 |
| 4,644,385 A | 2/1987 | Nakanishi et al. ............. 357/82 |
| 4,664,181 A | 5/1987 | Sumberg ............... 165/104.13 |
| 4,894,709 A | 1/1990 | Phillips et al. ................. 357/82 |
| 4,896,719 A | 1/1990 | O'Neill et al. ................ 165/170 |
| 4,903,761 A | 2/1990 | Cima ...................... 165/104.25 |
| 4,908,112 A | 3/1990 | Pace ........................ 204/299 R |
| 4,938,280 A | 7/1990 | Clark ......................... 165/80.4 |
| 4,978,638 A | 12/1990 | Buller et al. ................. 437/209 |
| 5,009,760 A | 4/1991 | Zare et al. ................. 204/183.3 |
| 5,016,090 A | 5/1991 | Galyon et al. ................. 357/82 |
| 5,016,138 A | 5/1991 | Woodman ................... 361/381 |
| 5,043,797 A | 8/1991 | Lopes ........................... 357/82 |
| 5,057,908 A | 10/1991 | Weber ........................... 357/81 |
| 5,058,627 A | 10/1991 | Brannen ........................ 138/27 |
| 5,070,040 A | 12/1991 | Pankove ....................... 437/209 |
| 5,083,194 A | 1/1992 | Bartilson ....................... 357/81 |
| 5,088,005 A | 2/1992 | Ciaccio ........................ 361/385 |
| 5,099,311 A | 3/1992 | Bonde et al. ................... 357/82 |
| 5,099,910 A | 3/1992 | Walpole et al. ............. 165/80.4 |
| 5,125,451 A | 6/1992 | Matthews .................. 165/80.4 |
| 5,131,233 A | 7/1992 | Cray et al. ..................... 62/64 |
| 5,145,001 A | 9/1992 | Valenzuela .................. 165/164 |
| 5,161,089 A | 11/1992 | Chu et al. .................... 361/385 |
| 5,179,500 A | 1/1993 | Koubek et al. ............... 361/385 |
| 5,199,487 A | 4/1993 | Difrancesco et al. .......... 165/168 |
| 5,203,401 A | 4/1993 | Hamburgen et al. ........ 165/80.4 |
| 5,218,515 A | 6/1993 | Bernhardt ................... 361/385 |
| 5,219,278 A | 6/1993 | Van Lintel ............. 417/413 R |
| 5,228,502 A | 7/1993 | Chu et al. .................. 165/80.4 |
| 5,230,564 A | 7/1993 | Bartilson et al. ............. 374/178 |
| 5,232,047 A | 8/1993 | Matthews .................... 165/168 |
| 5,239,200 A | 8/1993 | Messina et al. ............... 257/714 |
| 5,239,443 A | 8/1993 | Fahey et al. ................. 361/689 |
| 5,247,800 A | 9/1993 | Mruzek et al. ............... 62/51.1 |
| 5,263,251 A | 11/1993 | Matthews ............... 29/840.036 |
| 5,265,670 A | 11/1993 | Zingher ...................... 165/80.4 |
| 5,269,372 A | 12/1993 | Chu et al. ................... 165/80.4 |
| 5,274,920 A | 1/1994 | Matthews ............... 29/890.039 |
| 5,275,237 A | 1/1994 | Rolfson et al. ............. 165/80.5 |
| 5,281,026 A | 1/1994 | Bartilson et al. ............. 374/143 |
| 5,308,429 A | 5/1994 | Bradley ................... 156/306.6 |
| 5,309,319 A | 5/1994 | Messina ...................... 361/699 |
| 5,310,440 A | 5/1994 | Zingher ...................... 156/345 |
| 5,317,805 A | 6/1994 | Hoopman et al. ........ 29/890.03 |
| 5,325,265 A | 6/1994 | Turlik et al. ................. 361/702 |
| 5,336,062 A | 8/1994 | Richter .................... 417/413 A |
| 5,346,000 A | 9/1994 | Schlitt .................... 165/104.26 |
| 5,365,400 A | 11/1994 | Ashiwake et al. ............ 361/752 |
| 5,380,956 A | 1/1995 | Loo et al. .................... 174/252 |
| 5,383,340 A | 1/1995 | Larson et al. ................ 62/259.2 |
| 5,386,143 A | 1/1995 | Fitch .......................... 257/715 |
| 5,388,635 A | 2/1995 | Gruber et al. ............... 165/80.4 |
| 5,397,919 A | 3/1995 | Tata et al. .................... 257/717 |
| 5,421,943 A | 6/1995 | Tam et al. ................. 156/273.9 |
| 5,427,174 A | 6/1995 | Lomolino, Sr. et al. ......... 165/1 |
| 5,436,793 A | 7/1995 | Sanwo et al. ................. 361/689 |
| 5,459,099 A | 10/1995 | Hsu ............................ 437/180 |
| 5,490,117 A | 2/1996 | Oda et al. .................... 365/226 |
| 5,508,234 A | 4/1996 | Dusablon, Sr. et al. ...... 437/228 |
| 5,514,832 A | 5/1996 | Dusablon, Sr. et al. ..... 174/15.1 |
| 5,514,906 A | 5/1996 | Love et al. ................... 257/712 |
| 5,534,328 A | 7/1996 | Ashmead et al. |
| 5,544,696 A | 8/1996 | Leland ....................... 165/80.4 |
| 5,548,605 A | 8/1996 | Benett et al. ................... 372/36 |
| 5,564,497 A | 10/1996 | Fukuoka et al. ............. 165/152 |
| 5,575,929 A | 11/1996 | Yu et al. ...................... 216/10 |
| 5,579,828 A | 12/1996 | Reed et al. .................... 165/83 |
| 5,585,069 A | 12/1996 | Zanuzucchi et al. ......... 422/100 |
| 5,641,400 A | 6/1997 | Kaltenbach et al. ...... 210/198.2 |
| 5,646,824 A | 7/1997 | Osashi et al. ................ 361/699 |
| 5,658,831 A | 8/1997 | Layton et al. ................. 29/832 |
| 5,675,473 A | 10/1997 | McDunn et al. ............. 361/699 |
| 5,692,558 A | 12/1997 | Hamilton et al. ........... 165/80.4 |
| 5,696,405 A | 12/1997 | Weld ......................... 257/714 |
| 5,703,536 A | 12/1997 | Davis et al. .................. 330/289 |
| 5,704,416 A | 1/1998 | Larson et al. ........... 165/104.33 |
| 5,727,618 A | 3/1998 | Mundinger et al. ........ 165/80.4 |
| 5,740,013 A | 4/1998 | Roesner et al. ............. 361/697 |
| 5,757,070 A | 5/1998 | Fritz |
| 5,759,014 A | 6/1998 | Van Lintel ............... 417/413.3 |
| 5,763,951 A | 6/1998 | Hamilton et al. ............. 257/714 |
| 5,768,104 A | 6/1998 | Salmonson et al. ......... 361/704 |
| 5,800,690 A | 9/1998 | Chow ........................ 204/451 |
| 5,801,442 A | 9/1998 | Hamilton et al. ............. 257/714 |
| 5,810,077 A | 9/1998 | Nakamura et al. ........... 165/153 |
| 5,835,345 A | 11/1998 | Staskus et al. ................ 361/699 |
| 5,836,750 A | 11/1998 | Cabuz ......................... 417/322 |
| 5,858,188 A | 1/1999 | Soane et al. ................. 204/454 |
| 5,863,708 A | 1/1999 | Zanucchi et al. ............. 430/320 |
| 5,869,004 A | 2/1999 | Parce et al. .................. 422/100 |
| 5,870,823 A | 2/1999 | Bezama et al. ................ 29/848 |
| 5,874,795 A | 2/1999 | Sakamoto .................... 310/156 |
| 5,876,655 A | 3/1999 | Fisher ......................... 264/319 |
| 5,880,017 A | 3/1999 | Schwiebert et al. ......... 438/613 |
| 5,880,524 A | 3/1999 | Xie ............................. 257/704 |
| 5,886,870 A | 3/1999 | Omori ........................ 361/704 |
| 5,896,869 A | 4/1999 | Maniscalco et al. |
| 5,901,037 A | 5/1999 | Hamilton et al. ............. 361/699 |
| 5,918,469 A | 7/1999 | Cardella ........................ 62/3.7 |
| 5,921,087 A | 7/1999 | Bhatia et al. ................... 62/3.2 |
| 5,923,086 A | 7/1999 | Winer et al. ................. 257/713 |
| 5,936,192 A | 8/1999 | Tauchi ........................ 136/203 |
| 5,940,270 A | 8/1999 | Puckett ...................... 361/699 |
| 5,942,093 A | 8/1999 | Rakestraw et al. ........... 204/450 |
| 5,945,217 A | 8/1999 | Hanrahan .................... 428/389 |
| 5,960,866 A | 10/1999 | Kimura et al. .......... 165/104.33 |
| 5,964,092 A | 10/1999 | Tozuka et al. ................. 62/3.7 |

| | | | | | | |
|---|---|---|---|---|---|---|
| 5,965,001 A | 10/1999 | Chow et al. ............... 204/600 | | 6,417,060 B2 | 7/2002 | Tavkhelidze et al. ........ 438/380 |
| 5,965,813 A | 10/1999 | Wan et al. ............... 73/204.26 | | 6,424,531 B1 | 7/2002 | Bhatti et al. ............... 361/704 |
| 5,978,220 A | 11/1999 | Frey et al. ............... 361/699 | | 6,431,260 B1 | 8/2002 | Agonafer et al. ............ 165/80.4 |
| 5,983,997 A | 11/1999 | Hou ............... 165/144 | | 6,437,981 B1 | 8/2002 | Newton et al. ............... 361/700 |
| 5,993,750 A | 11/1999 | Ghosh et al. ............... 422/191 | | 6,438,984 B1 | 8/2002 | Novotny et al. ............ 62/259.2 |
| 5,997,713 A | 12/1999 | Beetz, Jr. et al. ............ 205/124 | | 6,443,222 B1 | 9/2002 | Yun et al. ............... 165/104.26 |
| 5,998,240 A | 12/1999 | Hamilton et al. ............ 438/122 | | 6,444,461 B1 | 9/2002 | Knapp et al. ............ 435/283.1 |
| 6,007,309 A | 12/1999 | Hartley ............... 417/322 | | 6,449,157 B1 | 9/2002 | Chu ............... 361/704 |
| 6,010,316 A | 1/2000 | Haller et al. ............... 417/322 | | 6,449,162 B1 | 9/2002 | Corbin, Jr. et al. ............ 361/719 |
| 6,012,902 A | 1/2000 | Parce | | 6,457,515 B1 | 10/2002 | Vafai et al. ............... 165/80.4 |
| 6,013,164 A | 1/2000 | Paul et al. ............... 204/450 | | 6,459,581 B1 | 10/2002 | Newton et al. ............... 361/700 |
| 6,014,312 A | 1/2000 | Schulz-Harder et al. .... 361/699 | | 6,459,582 B1 | 10/2002 | Ali et al. ............... 361/704 |
| 6,019,165 A | 2/2000 | Batchelder ............... 165/80.3 | | 6,466,442 B2 | 10/2002 | Lin ............... 361/695 |
| 6,019,882 A | 2/2000 | Paul et al. ............... 204/450 | | 6,477,045 B1 | 11/2002 | Wang ............... 361/700 |
| 6,021,045 A | 2/2000 | Johnson ............... 361/704 | | 6,492,200 B1 | 12/2002 | Park et al. ............... 438/113 |
| 6,034,872 A | 3/2000 | Chrysler et al. ............ 361/699 | | 6,495,015 B1 | 12/2002 | Schoeniger et al. ......... 204/600 |
| 6,039,114 A | 3/2000 | Becker et al. ............... 165/170 | | 6,508,301 B2 | 1/2003 | Marsala ............... 165/80.4 |
| 6,054,034 A | 4/2000 | Soane et al. ............... 204/601 | | 6,519,148 B2 | 2/2003 | Nakagawa et al. |
| 6,068,752 A | 5/2000 | Dubrow et al. ............... 204/604 | | 6,519,151 B2 | 2/2003 | Chu et al. ............... 361/699 |
| 6,084,178 A | 7/2000 | Cromwell ............... 174/35 | | 6,533,029 B1 | 3/2003 | Phillips ............... 165/104.26 |
| 6,090,251 A | 7/2000 | Sundberg et al. ............ 204/453 | | 6,533,840 B2 | 3/2003 | Martin et al. |
| 6,096,656 A | 8/2000 | Matzke et al. ............... 438/702 | | 6,536,516 B2 | 3/2003 | Davies et al. ............... 165/170 |
| 6,100,541 A | 8/2000 | Nagle et al. ............... 250/573 | | 6,537,437 B1 | 3/2003 | Galambos et al. ............ 204/600 |
| 6,101,715 A | 8/2000 | Fuesser et al. ............... 29/890.03 | | 6,543,521 B1 | 4/2003 | Sato et al. ............... 165/80.3 |
| 6,119,729 A | 9/2000 | Oberholzer et al. ............ 138/27 | | 6,553,253 B1 | 4/2003 | Chang ............... 604/20 |
| 6,126,723 A | 10/2000 | Drost et al. ............... 96/4 | | 6,572,749 B1 | 6/2003 | Paul et al. ............... 204/450 |
| 6,129,145 A | 10/2000 | Yamamoto et al. ............ 165/168 | | 6,578,626 B1 | 6/2003 | Calaman et al. ............ 165/80.4 |
| 6,129,260 A | 10/2000 | Andrus et al. ............... 228/120 | | 6,581,388 B2 | 6/2003 | Novotny et al. ............... 62/3.7 |
| 6,131,650 A | 10/2000 | North et al. ............... 165/170 | | 6,587,343 B2 | 7/2003 | Novotny et al. ............ 361/698 |
| 6,140,860 A | 10/2000 | Sandhu et al. ............... 327/513 | | 6,588,498 B1 | 7/2003 | Reyzin et al. ............ 165/104.33 |
| 6,146,103 A | 11/2000 | Lee et al. ............... 417/50 | | 6,591,625 B1 | 7/2003 | Simon ............... 62/259.2 |
| 6,154,363 A | 11/2000 | Chang ............... 361/699 | | 6,600,220 B2 | 7/2003 | Barber et al. ............... 257/685 |
| 6,159,353 A | 12/2000 | West et al. ............... 204/601 | | 6,601,643 B2 | 8/2003 | Cho et al. ............... 165/104.26 |
| 6,163,073 A | 12/2000 | Patel ............... 257/712 | | 6,606,251 B1 | 8/2003 | Kenny et al. ............... 361/764 |
| 6,166,907 A * | 12/2000 | Chien ............... 361/699 | | 6,651,735 B2 | 11/2003 | Cho et al. ............... 165/104.26 |
| 6,167,948 B1 | 1/2001 | Thomas ............... 165/104.26 | | 6,678,168 B2 | 1/2004 | Kenny, Jr. et al. |
| 6,171,067 B1 | 1/2001 | Parce ............... 417/48 | | 6,729,383 B1 | 5/2004 | Cannell et al. ............ 165/80.3 |
| 6,174,675 B1 | 1/2001 | Chow et al. ............... 435/6 | | 6,743,664 B2 | 6/2004 | Liang et al. ............... 438/124 |
| 6,176,962 B1 | 1/2001 | Soane et al. ............... 156/292 | | 6,863,117 B2 | 3/2005 | Valenzuela |
| 6,182,742 B1 | 2/2001 | Takahashi et al. ...... 165/104.33 | | 6,865,081 B2 | 3/2005 | Meyer et al. ............... 361/699 |
| 6,186,660 B1 | 2/2001 | Kopf-Sill et al. ............ 366/340 | | 6,881,039 B2 | 4/2005 | Corbin et al. |
| 6,196,307 B1 | 3/2001 | Ozmat ............... 165/185 | | 6,882,543 B2 | 4/2005 | Kenny et al. ............... 361/764 |
| 6,206,022 B1 | 3/2001 | Tsai et al. ............... 137/15.18 | | 6,950,303 B2 | 9/2005 | Neho et al. |
| 6,210,986 B1 | 4/2001 | Arnold et al. ............... 438/42 | | 6,986,382 B2 | 1/2006 | Upadhya et al. |
| 6,216,343 B1 | 4/2001 | Leland et al. ............ 29/890.032 | | 6,988,534 B2 | 1/2006 | Kenny et al. ............... 165/80.4 |
| 6,221,226 B1 | 4/2001 | Kopf-Sill ............... 204/602 | | 6,988,535 B2 | 1/2006 | Upadhya et al. |
| 6,227,287 B1 | 5/2001 | Tanaka et al. ............... 165/80.4 | | 6,992,891 B2 | 1/2006 | Mallik et al. ............... 361/704 |
| 6,227,809 B1 | 5/2001 | Forster et al. ............... 417/53 | | 6,994,151 B2 | 2/2006 | Zhou et al. |
| 6,234,240 B1 | 5/2001 | Cheon ............... 165/80.3 | | 7,000,684 B2 | 2/2006 | Kenny et al. |
| 6,238,538 B1 | 5/2001 | Parce et al. ............... 204/600 | | 7,017,654 B2 | 3/2006 | Kenny et al. |
| 6,253,832 B1 | 7/2001 | Hallefalt ............... 164/502 | | 7,019,972 B2 | 3/2006 | Kenny, Jr. et al. |
| 6,253,835 B1 | 7/2001 | Chu et al. ............... 165/80.4 | | 7,021,369 B2 | 4/2006 | Werner et al. ............ 165/104.33 |
| 6,257,320 B1 | 7/2001 | Wargo ............... 165/80.4 | | 7,044,196 B2 | 5/2006 | Shook et al. |
| 6,272,012 B1 | 8/2001 | Medin et al. ............... 361/690 | | 7,050,308 B2 | 5/2006 | Kenny, Jr. et al. |
| 6,277,257 B1 | 8/2001 | Paul et al. ............... 204/450 | | 7,052,751 B2 | 5/2006 | Smith et al. ............... 15/3 |
| 6,287,440 B1 | 9/2001 | Arnold et al. ............... 204/450 | | 7,061,104 B2 | 6/2006 | Kenny, Jr. et al. |
| 6,293,333 B1 | 9/2001 | Ponnappan et al. | | 7,077,634 B2 | 7/2006 | Munch et al. |
| 6,301,109 B1 | 10/2001 | Chu et al. ............... 361/690 | | 7,086,839 B2 | 8/2006 | Kenny et al. |
| 6,313,992 B1 | 11/2001 | Hildebrandt ............... 361/700 | | 7,090,001 B2 | 8/2006 | Zhou et al. |
| 6,317,326 B1 | 11/2001 | Vogel et al. ............... 361/704 | | 7,104,312 B2 | 9/2006 | Goodson et al. |
| 6,321,791 B1 | 11/2001 | Chow ............... 137/833 | | 7,124,811 B2 | 10/2006 | Crocker et al. ............ 165/104.33 |
| 6,324,058 B1 | 11/2001 | Hsiao ............... 361/699 | | 7,177,931 B2 | 10/2006 | Crocker et al. ............ 165/104.33 |
| 6,336,497 B1 | 1/2002 | Lin ............... 165/80.3 | | 7,143,820 B2 | 12/2006 | Crocker et al. ............ 165/104.33 |
| 6,337,794 B1 | 1/2002 | Agonafer et al. ............ 361/690 | | 7,156,159 B2 | 1/2007 | Lovette et al. |
| 6,366,462 B1 | 4/2002 | Chu et al. ............... 361/699 | | 7,188,662 B2 | 3/2007 | Brewer et al. |
| 6,366,467 B1 | 4/2002 | Patel et al. ............... 361/760 | | 7,201,012 B2 | 4/2007 | Munch et al. |
| 6,388,317 B1 | 5/2002 | Reese ............... 257/713 | | 7,201,214 B2 | 4/2007 | Munch et al. |
| 6,396,706 B1 | 5/2002 | Wohlfarth ............... 361/760 | | 7,228,888 B2 | 6/2007 | Eckberg et al. ............ 165/80.4 |
| 6,397,932 B1 | 6/2002 | Calaman et al. ............ 165/80.4 | | 7,278,549 B2 | 10/2007 | Munch et al |
| 6,400,012 B1 | 6/2002 | Miller et al. ............... 257/712 | | 7,293,423 B2 | 11/2007 | Upadhya et al. |
| 6,406,605 B1 | 6/2002 | Moles ............... 204/601 | | 7,301,773 B2 | 11/2007 | Brewer et al. |
| 6,415,860 B1 | 7/2002 | Kelly et al. ............... 165/748 | | 7,325,588 B2 | 2/2008 | Malone et al. |
| 6,416,642 B1 | 7/2002 | Alajoki et al. ............... 204/451 | | 7,344,363 B2 | 3/2008 | Munch et al. |

| | | | |
|---|---|---|---|
| 7,402,029 B2 | 7/2008 | Munch et al. | |
| 7,449,122 B2 | 11/2008 | Corbin et al. | |
| 7,455,103 B2 | 11/2008 | Sato et al. | 165/299 |
| 7,462,852 B2 | 12/2008 | Appleby et al. | |
| 7,539,020 B2* | 5/2009 | Chow et al. | 361/726 |
| 2001/0024820 A1 | 9/2001 | Mastromatteo et al. | 435/287.2 |
| 2001/0044155 A1 | 11/2001 | Paul et al. | 436/161 |
| 2001/0045270 A1 | 11/2001 | Bhatti et al. | 165/80.3 |
| 2001/0046703 A1 | 11/2001 | Burns et al. | 435/303.1 |
| 2001/0055714 A1 | 12/2001 | Cettour-Rose et al. | 429/122 |
| 2002/0011330 A1 | 1/2002 | Insley et al. | 165/133 |
| 2002/0075645 A1 | 6/2002 | Kitano et al. | 361/687 |
| 2002/0121105 A1 | 9/2002 | McCarthy, Jr. et al. | 62/500 |
| 2002/0134543 A1 | 9/2002 | Estes et al. | 165/277 |
| 2003/0077474 A1 | 4/2003 | Rabinkin et al. | |
| 2003/0121274 A1 | 7/2003 | Wightman | 62/222 |
| 2003/0128508 A1* | 7/2003 | Faneuf et al. | 361/687 |
| 2003/0205363 A1 | 11/2003 | Chu et al. | |
| 2003/0213580 A1 | 11/2003 | Philpott et al. | 165/46 |
| 2004/0040695 A1 | 3/2004 | Chesser et al. | 165/104.21 |
| 2004/0050231 A1 | 3/2004 | Chu et al. | 83/574 |
| 2004/0052049 A1 | 3/2004 | Wu et al. | 361/699 |
| 2004/0057211 A1 | 3/2004 | Kondo et al. | 361/696 |
| 2004/0070935 A1 | 4/2004 | Tomioka et al. | |
| 2004/0089008 A1 | 5/2004 | Tilton et al. | 62/259.2 |
| 2004/0099410 A1 | 5/2004 | Ghosh | 165/185 |
| 2004/0112585 A1 | 6/2004 | Goodson et al. | 165/299 |
| 2004/0125561 A1 | 7/2004 | Gwin et al. | 361/699 |
| 2004/0160741 A1 | 8/2004 | Moss et al. | 361/699 |
| 2004/0188069 A1 | 9/2004 | Tomioka et al. | 165/104.33 |
| 2004/0206477 A1 | 10/2004 | Kenny et al. | 165/80.4 |
| 2004/0207986 A1 | 10/2004 | Rubenstein | |
| 2005/0082666 A1 | 4/2005 | Lee et al. | 257/728 |
| 2005/0243516 A1* | 11/2005 | Stefanoski et al. | 361/699 |
| 2005/0257532 A1 | 11/2005 | Ikeda et al. | 62/3.7 |
| 2006/0137863 A1 | 6/2006 | Lee et al. | 165/104.33 |
| 2006/0161311 A1 | 7/2006 | Vinson et al. | 700/300 |
| 2006/0232945 A1 | 10/2006 | Chu et al. | |
| 2006/0245987 A1 | 11/2006 | Schmidt | |
| 2007/0109739 A1 | 5/2007 | Stefanoski | 361/687 |
| 2007/0152352 A1 | 7/2007 | McKinnell et al. | |
| 2007/0201210 A1* | 8/2007 | Chow et al. | 361/704 |
| 2007/0297136 A1* | 12/2007 | Konshak | 361/699 |
| 2008/0110963 A1 | 5/2008 | Lin et al. | |
| 2008/0205003 A1* | 8/2008 | Belady | 361/700 |

FOREIGN PATENT DOCUMENTS

| | | |
|---|---|---|
| JP | 64-24447 | 1/1989 |
| JP | 10-099592 | 4/1998 |
| JP | 2001-326311 | 11/2001 |
| TW | 183247 | 5/1995 |
| TW | 491931 | 6/2002 |
| TW | 516810 | 1/2003 |
| WO | 2005080901 A1 | 9/2005 |
| WO | 2007006590 A2 | 1/2007 |

OTHER PUBLICATIONS

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", 1995, IEEE Transactions on Components, Packaging, and Manufacturing Technology-Part A, vol. 18, No. 4, pp. 795-804.

Jerry K. Keska Ph. D. et al. "An Experimental Study on an Enhanced Microchannel Heat Sink for Microelectronics Applications", EEP-vol. 26-2, Advances in Electronic Packaging, 1999, vol. 2, pp. 1235-1259.

"Optimal Thermal Design of Air Cooled Forced Convection Finned Heat Sinks-Experimental Verification", Roy W. Knight et al., IEEE Transactions on Components, Hybrids, and Manufacturing, 1992, vol. 15.

"Experimental Study on Local Heat Transfer with Liquid Impingement Flow in Two-Dimensional Micro-Channels", Y. Zhuang et al., Dept. of Thermal Science and Engineering, Beijing CN., pp. 4055-4059.

"An Experimental and Theoretical Investigation of Fluid Flow and Heat transfer in Microtubes", D. Yu, R. Warrington, et al., Institute for Micromanufacturing, Louisiana Tech University pp. 523-530.

Micro Heat Exchangers Consisting of Pin Arrays', Xiaqing Yin, Dept of Mechanical Engineering and Applied Mechanics, University of Pennsylvania, PA., Jun. 1997, pp. 89-94.

"Modeling Forced Liquid Convection in Rectangular Microchannels with Electrokinetic Effects", Chun Yang et al., Department of Mechanical Engineering, and Department of Chemical Engineering both of Alberta, Canada, 1998, pp. 4229-4249.

"Analysis of Microchannels for Integrated Cooling", Arel Weisberg et al., University of Pennyslvania, PA., vol. 35, No. 10, pp. 2465-2474.

Two-Phase Flow in Microchannels, Roger S. Stanley and Randall F. Barron, Department of Mechanical and Industrial Engineering , Louisiana Tech University, LA, Tim A. Ameel, Department of Mechanical Engineering, Salt Lake City, UT, pp. 143-152.

"Enhancement of Critical Heat Flux from High Power Microelectronic Heat Sources in a Flow Channel", Issam Mudawar and Douglas E. Maddox, Journal of Electronic Packaging, Sep. 1990, vol. 112, pp. 241-248.

"Liquid Transport in Rectangular Micorchannels by Electroosmotic Pumping", Sarah Arulanandam and Dongqing Li, Dept. of Mechanical Engineering, University of Alberta, pp. 89-102.

Silicon Micromachining and Micromachines, M. Esashi, Tohoku University, Sendai 980 Japan, 1993, pp. 181-187.

"Optimum Design of Microchannel Heat Sinks", S.F. Choguette, M. Faghri M. Charmchi, and Y. Asako, ASME 1996, pp. 115-134.

"Single-Phase Flow Thermal Performance Characteristic of a Parallel Micro-Channel Heat Exchanger", T.S. Ravigururajan, J.Cuta, C.E. McDonald, and M.K Drost, ASME 1996, pp. 157-178.

"Thermal-Hydraulic Performance of Small Scale Micro-Channel and Porous-Media Heat-Exchangers", Pei-Xue Jiang, Ming-Hong Fan, Guang-Shu Si, and Ze-Pei Ren, Department of Thermal Engineenng, Tsinghua University.

"Two-Phase Electronic Cooling Using Mini-Channel and Micro-Channel Heat Sinks: Part 2-Flow rate and Pressure Drop Constraints", M.B. Bowers and I. Mudawar, Electronic Cooling Research Center, vol. 116, Dec. 1994, pp. 298-305.

"Thermal Management in Semiconductor Device Packaging", Mali Mahalingam, vol. 73, No. 9, Sep. 1985, pp. 1396-1404.

"Closed Loop Electroosmotic Microcharmel Cooling System for VLSI Circuits", Linan Jiang et al., Department of Mechanical Engineering, pp. 1-27.

"Forced Convection Boiling in a Microchannel Heat Sink", Linan Jiang, Man Wong, Yitshak Zohar, vol. 10, No. 1, Mar. 2001, pp. 80-87.

"Fused Quartz Substrates for Microchip Electrophoresis", Steven C. Jacobson, Alvin W. Moore and J. Michael Ramsey, Chemical and Analytical Sciences Division, Oak Ridge, TN, vol. 67, No. 13, Jul. 1, 1995, pp. 2059-2063.

"Experimental Investigation of Heat Transfer in Flat Plates with Rectangular Microchannels", X.F. Peng and B.X. Wang and G.P. Peterson and H.B. MA, vol. 38, No. 1, pp. 127-137, 1995.

"Electroosmotic Pumping and Valveless Control of Fluid Flow within a Manifold on a Glass Chip", Kurt Seiler, Zhonghui H. Fan, Karl Fluri and D. Jed Harrison, Department of Chemistry, University of Alberta, Canada, pp. 3485-3491.

"6 Liquid Flows in Microchannels", Kendra V. Sharp, Ronald J. Adrian, Juan G. Santiago and Joshua I. Molho, 38 pages.

"Modular Microchannel Cooled Heatsinks for High Average Power Laser Diode Arrays", Ray Beach, Barry L. Freitas D. Mundinger, Brian J. Comaskey, Richard W. Solarz and Mark Emanuel, IEEE Journal of Quantum Electronics, vol. 28, No. 4, Apr. 1992.

* cited by examiner

METHODOLOGY OF COOLING MULTIPLE HEAT SOURCES IN A PERSONAL COMPUTER THROUGH THE USE OF MULTIPLE FLUID-BASED HEAT EXCHANGING LOOPS COUPLED VIA MODULAR BUS-TYPE HEAT EXCHANGERS

RELATED APPLICATIONS

This application claims priority of U.S. provisional application, Ser. No. 60/791,242, filed Apr. 11, 2006, and entitled "METHODOLOGY OF COOLING MULTIPLE HEAT SOURCES IN A PERSONAL COMPUTER THROUGH THE USE OF MULTIPLE FLUID-BASED HEAT EXCHANGING LOOPS COUPLED VIA MODULAR BUS-TYPE HEAT EXCHANGERS", by these same inventors. This application incorporates U.S. provisional application, Ser. No. 60/791,242 in its entirety by reference.

FIELD OF THE INVENTION

The invention relates to a method of and apparatus for cooling a heat producing device in general, and specifically, to a method of and apparatus for cooling heat generating devices within a personal computer using liquid-based cooling systems.

BACKGROUND OF THE INVENTION

Cooling of high performance integrated circuits with high heat dissipation is presenting significant challenge in the electronics cooling arena. Conventional cooling with heat pipes and fan mounted heat sinks are not adequate for cooling chips with every increasing wattage requirements, including those exceeding 100 W.

Electronics servers, such as blade servers and rack servers, are being used in increasing numbers due to the higher processor performance per unit volume one can achieve. However, the high density of integrated circuits also leads to high thermal density, which is beyond the capability of conventional air-cooling methods.

A particular problem with cooling integrated circuits within personal computers is that more numerous and powerful integrated circuits are configured within the same size or small personal computer chassis. As more powerful integrated circuits are developed, each with an increasing density of heat generating transistors, the heat generated by each individual integrated circuit continues to increase. Further, more and more integrated circuits, such as graphics processing units, microprocessors, and multiple-chip sets, are being added to personal computers. Still further, the more powerful and more plentiful integrated circuits are being added to the same, or small size personal computer chassis, thereby increasing the per unit heat generated for these devices. In such configurations, conventional personal computer chassis' provide limited dimensions within which to provide an adequate cooling solution. Conventionally, the integrated circuits within a personal computer are cooled using a heat sink and a large fan that blows air over the heat sink, or simply by blowing air directly over the circuit boards containing the integrated circuits. However, considering the limited free space within the personal computer chassis, the amount of air available for cooling the integrated circuits and the space available for conventional cooling equipment, such as heat sinks and fans, is limited.

Closed loop liquid cooling presents alternative methodologies for conventional cooling solutions. Closed loop cooling solutions more efficiently reject heat to the ambient than air cooling solutions.

What is needed is a more efficient cooling methodology for cooling integrated circuits within a personal computer. What is also needed is a more efficient cooling methodology for cooling integrated circuits on multiple circuit boards mounted within a personal computer chassis.

SUMMARY OF THE INVENTION

Cooling systems of the present invention are directed to cooling solutions used to transfer heat produced by one or more heat generating devices, such as central processing units (CPUs), chipset, graphics processing units (GPUs), physics processing units (PPUs), or other integrated circuits, from one or more electronics boards within a personal computer chassis to the ambient. In some embodiments, a fluid-based, pumped cooling system is used. The cooling system is made up of two types of fluid loops. First, an expandable array of one or more collection loops, wherein one or more heat generating devices transfer heat to corresponding one or more heat exchanging devices. Heat is transferred from the one or more heat generating device to fluid passing through the collection loop via the one or more heat exchanging devices. The fluid is continually pumped through a series of flexible and inflexible tubing to a transfer cold plate.

The second fluid loop in the cooling system is a rejection loop. Heat is transferred from the fluid in the collection loop to a thermal bus of the rejection loop via thermal interface, thereby removing the heat from the collection loop. The fluid in the collection loop is then routed back to the heat exchanging device, continuing the cycle within the collection loop. In other embodiments, heat pipes or conduction means are used instead of the fluid-based, pumped collection loops. Within the rejection loop, a fluid is continuously pumped from the thermal bus to a fluid-to-air heat exchanging system, such as a fan and a fluid radiator, through a pump, and back to the thermal bus. Heat transferred to the thermal bus from the collection loop is transferred to the fluid passing through the thermal bus. The heated fluid is pumped through the fluid-to-air heat exchanging system where the heat is transferred from the fluid to the ambient. An optional TEC-based radiator can be included in either the collection loop or the rejection loop to improve the thermal performance of the cooling system, per the requirements of an application. The TEC unit is optimally placed downstream from the fluid-to-air heat exchanging system in the rejection loop for maximum system performance, although alternative configurations are also contemplated.

The hub of the cooling system is the thermal bus, which allows for transfer of heat from the collection loops to the rejection loop. The thermal bus provides a modular, scalable cooling system which allows for the expansion of cooling capacity without breaking the fluid lines. The collection loops are either pre-attached or subsequently attached to CPUs, GPUs, chipsets, and/or PPUs for easy installation at the thermal bus level.

In one aspect of the present invention, a cooling system for cooling one or more heat generating devices within a personal computer is described. The cooling system includes a personal computer chassis, one or more circuit boards mounted within the personal computer chassis, each circuit board including one or more heat generating devices, a primary heat exchanging system including a thermal bus and a first fluid passing therethrough, wherein the thermal bus is configured to thermally interface with one or more first heat exchanging devices, one or more fluid based cooling systems, each fluid based cooling system includes at least one of the first heat exchanging devices thermally coupled to the thermal bus and at least one second heat exchanging device, wherein each fluid based cooling system is thermally coupled to a corresponding one or more circuit boards such that each second heat exchanging device is thermally coupled to one of the heat generating devices on the corresponding one or more circuit boards, further wherein each fluid based cooling system includes a second fluid to receive heat transferred from each heat generating device of the corresponding one or more circuit boards via the second heat exchanging device, and a thermal interface coupled to the thermal bus and the first heat exchanging device of each fluid based cooling system to transfer heat between the first fluid and the second fluid.

In another aspect of the present invention, another cooling system for cooling one or more heat generating devices within a personal computer is described. The cooling system includes a personal computer chassis, a primary heat exchanging system including a thermal bus and a first fluid passing therethrough, wherein the primary heat exchanging system is configured to transfer a maximum thermal capacity, a scalable plurality of circuit boards removably mounted within the personal computer chassis, each circuit board including one or more heat generating devices that generate a thermal output, wherein a maximum number of circuit boards coupled to the primary heat exchanging system is determined according to the maximum thermal capacity of the primary heat exchanging system, and a scalable plurality of fluid based cooling systems, each fluid based cooling system includes at least one first heat exchanging device removably coupled to the thermal bus and at least one second heat exchanging device, wherein each fluid based cooling system is removably coupled to a corresponding one or more circuit boards such that each second heat exchanging device is removably coupled to one of the heat generating devices on the corresponding one or more circuit boards, further wherein each fluid based cooling system includes a second fluid passing therethrough.

For each aspect of the cooling system described above, the following features may also be applied. In some embodiments, each fluid based cooling system is a pumped fluid loop. In other embodiments, each fluid based cooling system includes a heat pipe. In yet other embodiments, one or more of the fluid based cooling system are a pumped fluid loop and one or more of the cooling loops include a heat pipe. At least one of the circuit boards can be a mother board. At least one circuit board can be removably mounted within the personal computer chassis. The removable circuit board can be a graphics card, a physics processing card, or other accessory card that includes one or more heat generating devices. The primary heat exchanging system forms a first closed fluid loop. The primary heat exchanging system includes a first pump, wherein the first pump is included in the first closed fluid loop. The primary heat exchanging system also includes a fluid-to-air heat exchanging system, wherein the fluid-to-air heat exchanging system is included in the first closed fluid loop. Each fluid based cooling system forms a second closed fluid loop. In some embodiments, each fluid based cooling system includes a second pump, wherein the second pump is included in the second closed fluid loop. In some embodiments, the second pump is integrated with the first heat exchanging device. The first fluid is physically isolated from the second fluid. The thermal bus is configured with fluid channels through which the first fluid passes. In some embodiments, fluid channels are configured in a parallel path relative to each other. In other embodiments, the fluid channels are configured in a serpentine path. In some embodiments, each second heat exchanging device is configured with micro-channels. The thermal interface layer also includes a thermal interface material to couple each first heat exchanging device to the thermal bus. Each first heat exchanging device includes a thermal interface geometry in contact with the thermal interface, the thermal interface geometry for each first heat exchanging device is independent of a thermal interface geometry of each other first heat exchanging device. The thermal interface geometry of each specific first heat exchanging device can be configured according to an amount of heat generated by the one or more heat generating devices thermally coupled to the fluid based cooling system corresponding to the specific first heat exchanging device. The thermal interface geometry for each first heat exchanging device can be scalable according to an amount of heat generated by the one or more heat generating devices thermally coupled to the fluid based cooling system corresponding to the specific first heat exchanging device. In some embodiments, primary heat exchanging system is configured in a fixed position within the personal computer chassis. The first heat exchanger of each fluid based cooling system is fixed to the thermal bus and a remaining portion of the fluid based cooling system is configured so as to be flexibly positioned within the personal computer chassis. Each first heat exchanger of each fluid based cooling system is fixed to the corresponding heat generating device and a remaining portion of the fluid based cooling system is independent of the one or more circuit boards. In some embodiments, the thermal bus is segmented, each segment is coupled via fluid lines and each segment is distributed throughout the personal computer chassis. In some embodiments, a secondary heat exchanging system is included to remove thermal output from the one or more heat generating devices that exceed the maximum thermal capacity of the primary heat exchanging system.

Other features and advantages of the present invention will become apparent after reviewing the detailed description of the embodiments set forth below.

BRIEF DESCRIPTION OF THE DRAWINGS

The present invention is described relative to the several views of the drawings. Where appropriate and only where identical elements are disclosed and shown in more than one drawing, the same reference numeral will be used to represent such identical elements.

DETAILED DESCRIPTION OF THE PRESENT INVENTION

Figure 1:
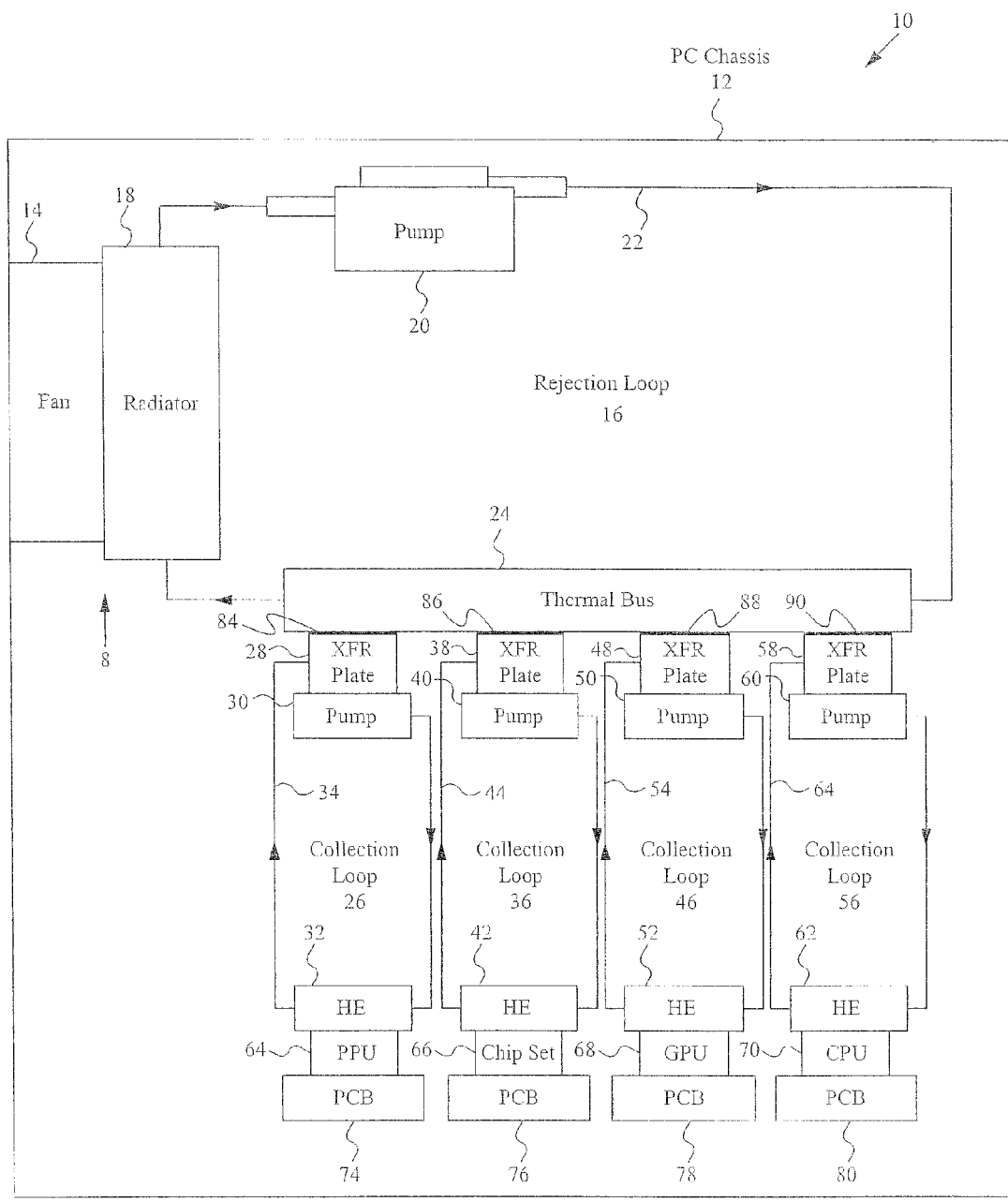
FIG. 1 illustrates a side view of an exemplary cooling system according to a first embodiment of the present invention.

Embodiments of the present invention are directed to a scalable and modular cooling system that removes heat generated by one or more heat generating devices within a personal computer. The heat generating devices include, but are not limited to, one or more central processing units (CPU), a chipset used to manage the input/output of one or more CPUs, one or more graphics processing units (GPUs), and/or one or more physics processing units (PPUs), mounted on a motherboard, a daughter card, and/or a PC expansion card. The cooling system can also be used to cool power electronics, such as mosfets, switches, and other high-power electronics requiring cooling. In general, the cooling system described herein can be applied to any electronics sub-system that includes a heat generating device to be cooled. For simplicity, any sub-system installed within the personal computer that includes one or more heat generating device to be cooled is referred to as a PC card.

The cooling system is configured to be scalable and modular such that new PC cards including heat generating devices can be added to the personal computer and coupled to the cooling system. Additionally, already installed PC cards can be swapped for new or upgraded PC cards. The cooling system is configured to accommodate PC cards with varying cooling needs. That is, the heat removal requirements of one PC card can vary from the heat removal of another PC card and still be accommodated by the cooling system.

The cooling system includes two basic components. First, the cooling system includes a rejection loop, which includes a fluid-to-air heat exchanging system, a pump, and a thermal bus including fluid channels configured therein. The fluid-to-air heat exchanging system includes a heat rejector, such as one or more radiators, and one or more fans. The one or more fans generate airflow over the surface of the heat rejector. The heat rejector is preferably a counter flow radiator. The thermal bus is capable of accepting one or more transfer cold plates. Each transfer cold plate is coupled to the thermal bus using a mounting mechanism. The components within the rejection loop are coupled by flexible or inflexible tubing in a sealed, closed loop configuration.

Second, the cooling system includes one or more collection loops, each collection loop includes one or more transfer cold plates with fluid channels configured therein, a pump, and one or more heat exchanging devices with fluid channels configured therein, such as a microchannel cold plate (MCP), in a sealed, closed loop system. The pumps in the rejection loop and the collection loops are any conventional pumps, including, but not limited to, an electro-osmotic pump and a mechanical pump. The components within each collection loop are coupled by flexible tubing. Alternatively, any means for transporting fluid within a sealed environment can be used. In some embodiments, inflexible tubing is used in the collection loop. The collection loops are coupled to the rejection loop by the transfer cold plate of the collection loop mated with the thermal bus of the rejection loop. Each heat exchanging device in a collection loop is thermally coupled to a heat generating device. In some embodiments, one heat exchanging device is coupled to one heat generating device. In other embodiments, there is a one to many relationship, such as one heat exchanging device coupled to multiple heat generating devices, or multiple heat exchanging devices coupled to one heat generating device. In some embodiment, each collection loop includes one heat exchanging device. In other embodiments, one or more of the collection loops includes more than one heat exchanging device. In this case, one collection loop can be coupled to one or more PC boards. To couple the heat exchanging device to the heat generating device, a mounting mechanism is used. In other embodiments, one, some, or all of the collection loops are configured using heat pipes coupled to the one or more heat generating devices and the transfer cold plate.

The dual loop configuration allows a permanent cooling loop, the rejection loop, to be installed in a computer chassis and expanded through the use of one or more collection loops, which transports heat generated by one of a plurality of CPUs, GPUs, chipsets, and/or PPUs to the rejection loop through the transfer cold plate(s). In some embodiments, the rejection loop is fixed in position relative to the personal computer chassis, and each of the collection loops are flexible in position. In this manner, the collection loops are easily manipulated within the PC chassis for ease of installation, whether it be a new collection loop added to the cooling system or a PC card replacement using an existing collection loop. Flexible positioning of the collection loop also accommodates various sized and configured PC cards.

The modular nature of the collection loops allows for the flexible installation of collection loops for a plurality of heat generating devices at any time during the useful life of the cooling system without the need of having to break open a fluid loop to add cold plates and/or heat exchanging devices. This modular nature also allows for easy maintenance or replacement of defective collection or rejection loops, without the need to drain and recharge the entire cooling system.

By having separate cooling loops, fluids within each loop can be optimized for corrosion resistance, materials compatibility, heat capacity/heat transfer properties, and freeze protection. Design also lends itself to high-volume manufacturing. The modular components are much simpler than that of a traditional sealed, closed loop system with multiple cold plates and radiators, making installation of the unit a simple, direct operation, rather than one that involves direct or indirect manipulation of several components to make the liquid cooling system (LCS) fit properly into a computer chassis.

In some embodiments, an in-line peltier, or thermo-electric cooling module (TEC) is added to either the collection loop, the rejection loop, or both. The TEC includes a liquid-side routing, mounted to the cold side of the TEC, and dissipation fins mounted to the hot side of the TEC.

In some embodiments, the cooling system includes an electrical distribution board. The electrical distribution board includes an input electrical receptacle, a series of output electrical receptacles, and a series of sensory electrical receptacles. The input electrical receptacle accepts standard power inputs from a personal computer power supply. The series of output electrical receptacles provide power and control signals to the pumps and fans used in the cooling system. In this manner, one electrical connection to the host machine splits to provide power to all pumps in the cooling system. The series of sensory electrical receptacles accept supplemental inputs used to modify the behavior of the cooling system during operation. Examples of supplemental inputs include, but are not limited to, pump tachometer signal(s), air mover tachometer signal(s), fluid temperatures, device temperatures (CPU, GPU, chipsets, and/or PPU), ambient air temperature, and other inputs from the heat generating devices being cooled.

FIG. 1 illustrates a perspective view of an exemplary cooling system 10 according to a first embodiment of the present invention. The cooling system 10 includes a personal computer chassis housing 12 for housing a rejection loop 16 and collection loops 26, 36, 46, 56. For simplicity, additional standard components of a personal computer, such as a hard disk drive, power supply, mother board, and other conventional circuitry, are not shown in FIG. 1 nor further discussed herein as such components are well known in the art. Each collection loop 26, 36, 46, 56 is coupled to a heat generating device, such as a PPU 62, a chip set 66, a GPU 68, and a CPU 70. Each heat generating device is coupled to a printed circuit board 74, 76, 78, 80, such as a motherboard, daughter card, or PC expansion card. For purposes of discussion, each printed circuit board includes a single heat generating device, and each collection loop is coupled to a single heat generating device. It is understood that each printed circuit board can include more than one heat generating device and that each collection loop can include more than one heat exchanging device. Although four collection loops are shown in FIG. 1, it is understood that more or less than four collection loops can be included in the cooling system 10. In general, a maximum of N collection loops can be coupled to and effectively cooled by the rejection loop 16. The maximum number N is determined according to the thermal heat dissipating capacity of the rejection loop 16, and by the amount of heat generated by the heat generating devices coupled to the collection loops, as is discussed in greater detail below.

The rejection loop 16 includes a thermal bus 24, a fluid-to-air heat exchanging system 8, a pump 20. The fluid-to-air heat exchanging system 8 includes a heat rejector 18 and a fan 14. The pump 20 and the heat rejector 18 are coupled to the thermal bus 24. Preferably, the pump 20 is a mechanical pump. Alternatively, the pump 20 is an electro-osmotic pump. However, it is apparent to one skilled in the art that any type of pump is alternatively contemplated. The heat rejector 18 is preferably a radiator with micro-channels and fins positioned closely together. More preferably, the heat rejector 18 is a counter flow radiator of the type described in U.S. Pat. No. 6,988,535, which is hereby incorporated by reference. However, it is apparent to one skilled in the art that any type of heat rejector is alternatively contemplated. The fan 14 comprises one or more blowing fans for generating air flow across and/or through the heat rejector 18.

It is understood that the fluid flow in the rejection loop 16 can be opposite of that shown in FIG. 1. It is also understood that the relative position of each component in the rejection loop 16 is for exemplary purposes only. For example, the pump 20 can be positioned between the output of the thermal bus 24 and the input of the radiator 18.

A first collection loop 26, a second collection loop 36, a third collection loop 46, and a fourth collection loop 56 are each mounted and thermally coupled to the thermal bus 24 of the rejection loop 16. The collection loop 26 includes a heat exchanging device 32, a pump 30, and a transfer cold plate 28, each coupled by fluid lines 34. The collection loop 36 includes a heat exchanging device 42, a pump 40, and a transfer cold plate 38, each coupled by one or more fluid lines 44. The collection loop 46 includes a heat exchanging device 52, a pump 50, and a transfer cold plate 48, each coupled by one or more fluid lines 54. The collection loop 56 includes a heat exchanging device 62, a pump 60, and a transfer cold plate 58, each coupled by one or more fluid lines 64. For purposes of discussion, only the configuration and operation of the collection loop 26 is subsequently described. Each of the other collection loops 36, 46, 56 is configured and operates similarly to that of the collection loop 26. However, it is understood that each collection loop can be configured independently, such as with different numbers of heat exchanging devices, with the general functionality of cooling the heat generating devices remaining substantially the same.

The collection loop 26 is a fluid based, pumped cooling loop. The collection loop 26 includes one heat exchanging device 32 for each heat generating device 64 on the corresponding PC card. In this exemplary case, the collection loop 26 is configured to cool a single heat generating device.

Preferably, the pump 30 is a mechanical pump. Alternatively, the pump 30 is an electro-osmotic pump. However, it is apparent to one skilled in the art that any type of pump is alternatively contemplated. Preferably, each heat exchanging device 32 is a fluid-based, micro-channel heat exchanger of the type described in U.S. Pat. No. 7,000,684, which is hereby incorporated by reference. However, it is apparent to one skilled in the art that any type of fluid-based heat exchanger is alternatively contemplated. Preferably, the transfer cold plate 28 is configured with micro-channels that maximize a surface area exposed to a fluid passing therethrough.

As shown in FIG. 1, the transfer cold plate 28 is coupled directly to the pump 30. In this configuration, one or more fluid lines 34 input fluid to the transfer cold plate 28, the fluid is cooled within the transfer plate 28, the fluid is delivered from the transfer cold plate 28 to the pump 30, and the fluid is output from the pump 30 to the one or more fluid lines 34. Alternatively, the fluid is input to the pump 30 and output from the transfer cold plate 28. Such exemplary configurations are described in the co-owned, co-pending U.S. patent application Ser. No. (Cool 06000), filed Mar. 30, 2007, and entitled "INTEGRATED FLUID PUMP AND RADIATOR RESERVOIR" which is hereby incorporated in its entirety by reference. In other embodiments, the transfer cold plate 28 and the pump 30 are not directly coupled, and instead are coupled by one or more fluid lines. In still other embodiments, the pump 30 is coupled directly to the heat exchanging device 32. In general, there is complete design flexibility that can be configured on an application-specific basis.

A bottom surface of the transfer cold plate 28 is thermally coupled to a top surface of the thermal bus 24 via a thermal interface material (not shown). The thermal interface material is preferably a compliant material such as thermal grease, thermal pad, solder, or any type of thermally conducting gap filling material. A mounting mechanism (not shown) is used to secure the transfer cold plate 28 to the thermal bus 24. Any conventional mounting mechanism can be used, including, but not limited to, one or more clamps, one or more screws, one or more spring clips, a gimble mechanism, mounting tabs, any other conventional retention mechanism, or one or more combinations thereof. In this manner, the transfer cold plate 28 is thermally coupled to the thermal bus 24. The thermal bus 24 is preferably configured with fluid channels that maximize a surface area exposed to a fluid passing there through.

Although the collection loop 26 is shown in FIG. 1 as including a single heat exchanging device 32, numerous alternative configurations are also contemplated in shown the collection loop includes more than one heat exchanging device. For example, two or more heat exchanging devices can be configured in series. In this case, fluid first flows into a first of the heat exchanging devices and then fluid exiting the first heat exchanging device is input to the second heat exchanging device. Alternatively, two or more heat exchanging devices can be configured in parallel such that fluid reaching any of the heat exchanging devices has not previously passed through, and been heated by, another heat exchanging device. In this manner, fluid reaching any heat exchanging device configured in parallel is cooler than if the fluid first passes through a serially connected heat exchanging device. In such an alternative configuration, the pump 30 is coupled to the first heat exchanging device by one or more fluid lines, and separate fluid lines couple the pump 30 to the second heat exchanging device, and so on. In yet other alternative configurations, multiple heat exchanging devices are configured in any combination of series and parallel configurations.

The transfer cold plate 28, the pump 30, the heat exchanging device 32, and the fluid lines 34 form a first closed loop through which fluid flows. A function of the collection loop 26 is to capture heat generated by the heat generating device 64. The heat exchanging device 32 is thermally coupled to heat generating device 64. As fluid flows through first closed loop to the heat exchanging device 32, heat from the heat generating device 64 is transferred to the fluid.

A bottom surface of the heat exchanging device 32 is thermally coupled to a top surface of the heat generating device via a thermal interface material (not shown). The thermal interface material is preferably a compliant material such as thermal grease, thermal pad, solder, or any type of thermally conducting gap filling material. A mounting mechanism (not shown) is used to secure the heat exchanging device 32 to the heat generating device 64. Any conventional mounting mechanism can be used, including, but not limited to, one or more clamps, one or more screws, one or more spring clips, a gimble mechanism, mounting tabs, any other conventional retention mechanism, or one or more combinations thereof.

The type of fluid used in each collection loop 26, 36, 46, 56 and the rejection loop 16 is preferably water-based. Alternatively, the fluid is based on combinations of organic solutions, including but not limited to propylene glycol, ethanol and isopropanol (IPA). Still alternatively, the fluid is a pumped refrigerant. The fluid used also preferably exhibits a low freezing temperature and has anti-corrosive characteristics. Depending on the operating characteristics of the cooling system and the heat generating devices, in one embodiment, the fluid exhibits single phase flow while circulating within the cooling loops. In another embodiment, the fluid is heated to a temperature to exhibit two phase flow, wherein the fluid undergoes a phase transition from liquid to a vapor or liquid/vapor mix.

The heated fluid flows from the heat exchanging device 32 into the fluid channels within the transfer cold plate 28. Heat is transferred from the heated fluid within the fluid channels to the material of the transfer cold plate 28. A thermal interface material (not shown) provides efficient heat transfer between the transfer cold plate 28 and the thermal bus 24 so that heat from the transfer cold plate 28 is transferred to the material of the thermal bus 24.

The physical dimensions of the thermal bus and the transfer cold plate for each collection loop are designed to maximize the thermal transfer between the two. As the thermal bus is fixed within the personal computer chassis, the physical dimensions of the thermal bus are therefore also fixed, specifically a fixed width and fixed length of the top contact surface to be mated with the transfer cold plates. Multiple transfer cold plates can be aligned along the length of the thermal bus. The width of each transfer cold plate is substantially similar to the width of the thermal bus, and is substantially the same from transfer cold plate to transfer cold plate. However, the length of each transfer cold plate can differ from transfer cold plate to transfer cold plate. The specific length of each transfer cold plate can be designed according to the heat dissipation needs of the collection loop, and the corresponding one or more heat generating devices to which the collection loop is coupled.

In particular, the greater the amount of heat generated by the one or more heat generating devices, the greater the heat transferred to the collection loop. As such, the greater the amount of heat transferred to the collection loop, the greater the need to transfer heat from the transfer cold plate to the thermal bus. Those collection loops configured to dissipate a relatively greater amount of heat are configured with transfer cold plates with a greater length, thereby providing a greater thermal interface geometry 84, 86, 88, 90 between the transfer cold plate and the thermal bus. Those collection loops configured to dissipate a relatively lower amount of heat are configured with transfer cold plates with a smaller length. The thermal interface geometry of each transfer cold plate determines an amount of heat that can be transferred to the thermal bus, typically measured as a heat dissipation rate. The total heat dissipation rate for all transfer cold plates coupled to the thermal bus can not exceed the maximum thermal dissipation rate of the thermal bus. In some embodiments, the maximum thermal dissipation rate of the thermal bus is fixed characteristic of the cooling system. In other embodiments, the rejection loop is scalable to increase the maximum thermal dissipation rate, such as increasing the thermal dissipation capacity of the fluid-to-air heat exchanging system by adding one or more radiators and/or fans.

In still other embodiments, one or more complimentary conventional cooling systems are included within the PC chassis, for example a standard air cooling system, to cool some or all of a thermal load that exceeds the maximum thermal dissipation rate of the thermal bus 24. Such a complimentary cooling system can also be used to cool one or more heat generating devices that are not coupled to the cooling system 10.

Referring to FIG. 1, the thermal bus 24, the heat rejector 18, the pump 20, and the fluid lines 22 form a second closed loop through which fluid flows. The fluid in the second closed loop preferably comprise the same type of fluid discussed above in relation to the first closed loop. The fluid in the second closed loop is independent of the fluid in the first closed loop.

A function of the second closed loop and the liquid-to-air heat exchanging system 8 is to transfer heat from the thermal bus 24 to the ambient. As fluid flows through the fluid channels within the thermal bus 24, heat from the material of the thermal bus 24 is transferred to the fluid.

The heated fluid within the thermal bus flows to the heat rejector 18. As the heated fluid flow through the heat rejector 18, heat is transferred from the fluid to the material of the heat rejector 18. The fan 14 blows air over the surface of the heat rejector 18 such that heat is transferred from the heat rejector 18 to the ambient. Preferably, the PC chassis 12 includes intake vents and exhaust vents through which air enters and leaves the cooling system 10. Cooled fluid leaving the heat rejector 18 flows back to the thermal bus 24.

Figure 2:
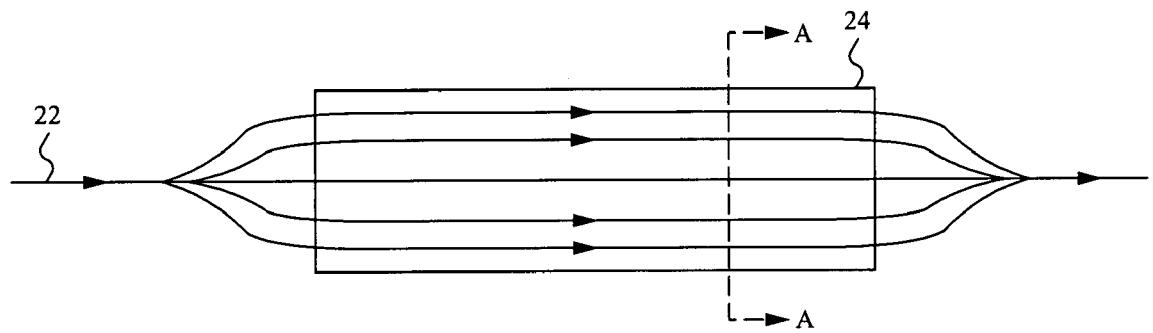
FIG. 2 illustrates a cut-out, top-down view of the thermal bus according to a parallel path configuration.
Figure 3:
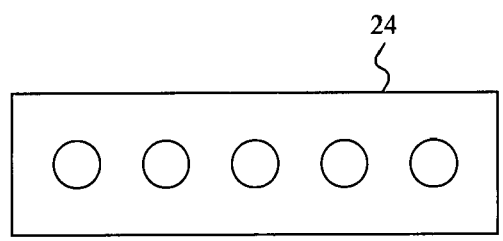
FIG. 3 illustrates a cut-out side view of the thermal bus shown in FIG. 2.

FIG. 2 illustrates a cut-out, top-down view of the thermal bus 24 according to a parallel path configuration. In the parallel path configuration, the fluid channels in the thermal bus 24 are configured in a parallel path extending from an entry point within the thermal bus 24 to an exit point. FIG. 3 illustrates a cut-out side view of the thermal bus 24 along the line A-A shown in FIG. 2. Although five fluid channels are shown in FIGS. 2 and 3, the thermal bus can be configured with more or less than five fluid channels. As shown in FIG. 2, the single fluid line 22 splits into multiple fluid lines prior to entering the thermal bus 24, and multiple fluid lines that exit the thermal bus 24 are re-joined to form a single fluid line 22. In this configuration, the thermal bus 24 is configured with multiple fluid channel input ports to which the multiple input and output fluid lines are coupled. In an alternative configuration, a single fluid line 22 enters and exits the thermal bus 24, and the single fluid line splits into multiple fluid channels within the thermal bus 24. In another configuration, multiple fluid lines 22 enter the thermal bus 24. Any of these fluid lines 22 can flow into multiple channels, or can flow into a single fluid channel. Any other configuration of multiple fluid lines flowing into and/or being split into multiple fluid channels within the thermal bus 24 are also considered.

Figure 4:
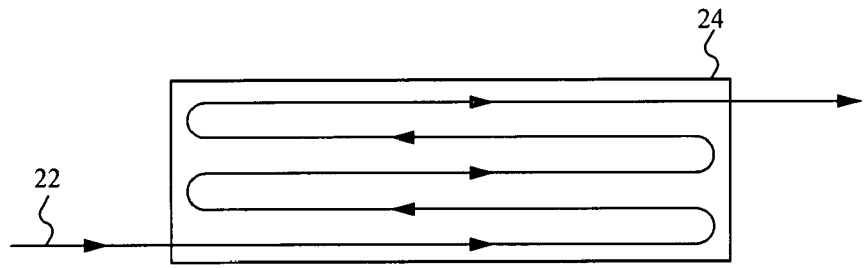
FIG. 4 illustrates a cut-out, top-down view of the thermal bus according to a serpentine path configuration.

FIG. 4 illustrates a cut-out, top-down view of the thermal bus 24 according to a serpentine path configuration. In the serpentine path configuration, the fluid channels in the thermal bus 24 are configured in a winding, serpentine path extending from an entry point within the thermal bus 24 to an exit point. Although a single entry point and a single exit point are shown in FIG. 3, multiple such entry and exit points are also contemplated. Further, the fluid channels can be configured in any non-parallel configuration to achieve a similar effect. Specifically, the serpentine path configuration distributes substantially equally the thermal gradient across all transfer cold plates coupled to the thermal bus, regardless of the relative position that each transfer cold plate is coupled to the thermal bus. This provides the advantage of negating the order that the transfer cold plates are positioned on the thermal bus. It is understood that alternative fluid channel path configurations are also contemplated.

Figure 5:
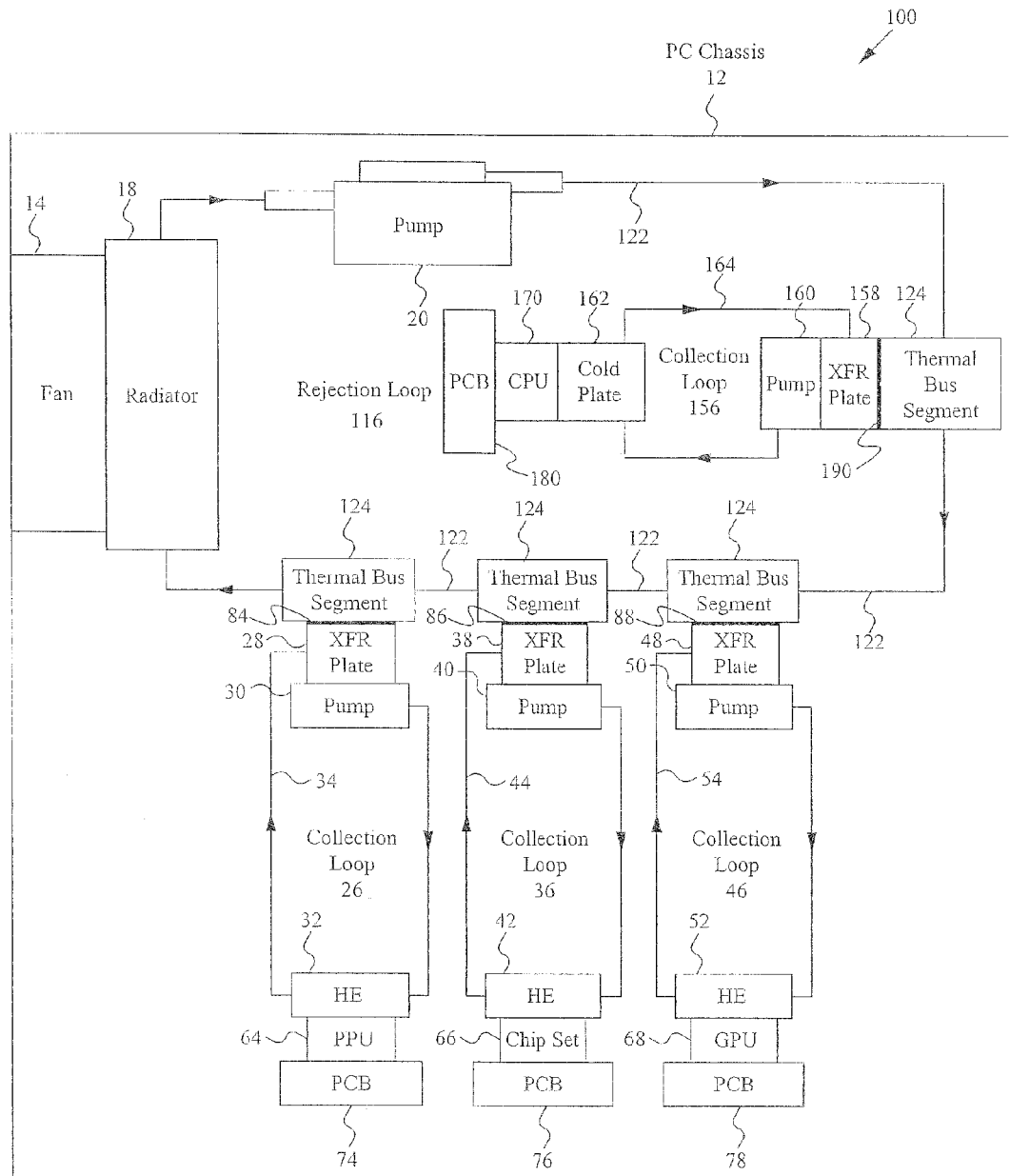
FIG. 5 illustrates a side view of an exemplary cooling system according to a second embodiment of the present invention.

FIG. 5 illustrates a side view of an exemplary cooling system according to a second embodiment of the present invention. The cooling system 10 can be identical to the cooling system 10 of FIG. 1 with the exception that the thermal bus 24 of cooling system 10 is replaced by a distributed thermal bus 124, where each segment of the thermal bus 124 is coupled by one or more fluid lines 122, and the collection loop 56 is replaced by the collection loop 156. The collection loop 156 includes a transfer cold plate 158, a pump 160, and a heat exchanging device 162 coupled together by one or more fluid lines 164. The transfer cold plate 158 is thermally coupled to the thermal bus segment 124, and the heat exchanging device 162 is coupled to the heat generating device 170, such as the personal computer CPU. The collection loop 156 is configured and operates similarly to the collection loop 56 (FIG. 1). The distributed configuration of the cooling system 100 emphasizes an alternative approach to coupling the cooling system to heat generating devices distributed within the personal computer chassis 12, such as the position of the system motherboard versus the positions of the PC extension cards. The cooling system 10 of FIG. 1 provides design flexibility through adaptive configurations of the various collection loops to match the positions of the variously distributed heat generating devices. In contrast, the cooling system 100 of FIG. 5 provides design flexibility through an adaptive configuration of the thermal bus, where segments of the thermal bus are positioned proximate the variously distributed heat generating devices.

It is apparent to one skilled in the art that the present cooling system is not limited to the components shown in FIGS. 1-5 and alternatively includes other components and devices. For example, although not shown in FIG. 1, the cooling system 10 can also include a fluid reservoir coupled to either one or more of the collection loops, or the rejection loop, or both closed loops. The fluid reservoir accounts for fluid loss over time due to permeation.

Additionally, although each of the embodiments described above in regards to FIGS. 1-5 are directed to liquid-based cooling systems, alternative cooling systems, such as heat pipes and conduction means, can be used. Heat pipes are especially effective when used with the segmented thermal bus embodiment of FIG. 5. In this case, a thermal bus segment is positioned relatively closely to the heat generating device, and a heat pipe is coupled to the heat generating device and the thermal bus segment. It is also contemplated that a single cooling system can be configured with one or more pumped collection loops and one or more heat pipe-based collection loops.

In some embodiments, the cooling system is configured to cool each heat generating device included within the PC chassis. In other embodiments, the cooling system is configured to cool only select heat generating devices, or only a single heat generating device, while other heat generating devices are left to be cooled by other or complimentary means.

In some embodiments, the modular nature of the cooling system allows the collection loops to be contained within an enclosure in the personal computer chassis, rejecting heat from the collection loops through the thermal bus to a rejection loop outside of, or within another compartment of, the enclosure.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A cooling system for cooling one or more heat generating devices within a personal computer, the cooling system comprising:
   a. a personal computer chassis;
   b. one or more circuit boards mounted within the personal computer chassis, each circuit board including one or more heat generating devices;
   c. a primary heat exchanging system including a thermal bus and a first fluid passing therethrough, wherein the thermal bus is configured to thermally interface with one or more first heat exchanging devices, wherein the primary heat exchanging system is a closed system contained within the personal computer chassis and is configured to cool the first fluid therein;
   d. one or more fluid based cooling systems, each fluid based cooling system includes at least one of the first heat exchanging devices thermally coupled to the thermal bus and at least one second heat exchanging device, wherein each fluid based cooling system is thermally coupled to a corresponding one or more circuit boards such that each second heat exchanging device is thermally coupled to one of the heat generating devices on the corresponding one or more circuit boards, further wherein each fluid based cooling system includes a second fluid to receive heat transferred from each heat generating device of the corresponding one or more circuit boards via the second heat exchanging device; and
   e. a thermal interface coupled to the thermal bus and the first heat exchanging device of each fluid based cooling system to transfer heat between the first fluid and the second fluid.

2. The cooling system of claim 1 wherein each fluid based cooling system comprises a pumped fluid loop.

3. The cooling system of claim 1 wherein each fluid based cooling system comprises a heat pipe.

4. The cooling system of claim 1 wherein one or more of the fluid based cooling systems comprises a pumped fluid loop and one or more of the fluid based cooling systems comprises a heat pipe.

5. The cooling system of claim 1 wherein at least one of the circuit boards comprises a mother board.

6. The cooling system of claim 1 wherein at least one circuit board is removably mounted within the personal computer chassis.

7. The cooling system of claim 6 wherein the removable circuit board comprises a graphics card, a physics processing card, or other accessory card that includes one or more heat generating devices.

8. The cooling system of claim 1 wherein the primary heat exchanging system forms a first closed fluid loop.

9. The cooling system of claim 8 wherein the primary heat exchanging system further comprises a first pump, wherein the first pump is included in the first closed fluid loop.

10. The cooling system of claim 9 wherein the primary heat exchanging system further comprises a fluid-to-air heat exchanging system, wherein the fluid-to-air heat exchanging system is included in the first closed fluid loop.

11. The cooling system of claim 1 wherein each fluid based cooling system forms a second closed fluid loop.

12. The cooling system of claim 11 wherein each fluid based cooling system further comprises a second pump, wherein the second pump is included in the second closed fluid loop.

13. The cooling system of claim 12 wherein the second pump is integrated with the first heat exchanging device.

14. The cooling system of claim 1 wherein the first fluid is physically isolated from the second fluid.

15. The cooling system of claim 1 wherein the thermal bus is configured with fluid channels through which the first fluid passes.

16. The cooling system of claim 15 wherein the fluid channels are configured in a parallel path relative to each other.

17. The cooling system of claim 15 wherein the fluid channels are configured in a serpentine path.

18. The cooling system of claim 1 wherein each second heat exchanging device is configured with micro-channels.

19. The cooling system of claim 18 wherein the thermal interface layer further comprises a thermal interface material to couple each first heat exchanging device to the thermal bus.

20. The cooling system of claim 1 wherein each first heat exchanging device includes a thermal interface geometry in contact with the thermal interface, the thermal interface geometry for each first heat exchanging device is independent of a thermal interface geometry of each other first heat exchanging device.

21. The cooling system of claim 20 wherein the thermal interface geometry of each specific first heat exchanging device is configured according to an amount of heat generated by the one or more heat generating devices thermally coupled to the fluid based cooling system corresponding to the specific first heat exchanging device.

22. The cooling system of claim 1 wherein each specific first heat exchanging device includes a thermal interface geometry in contact with the thermal interface, the thermal interface geometry for each first heat exchanging device is scalable according to an amount of heat generated by the one or more heat generating devices thermally coupled to the fluid based cooling system corresponding to the specific first heat exchanging device.

23. The cooling system of claim 1 wherein the primary heat exchanging system is configured in a fixed position within the personal computer chassis.

24. The cooling system of claim 23 wherein the first heat exchanger of each fluid based cooling system is fixed to the thermal bus and a remaining portion of the fluid based cooling system is configured so as to be flexibly positioned within the personal computer chassis.

25. The cooling system of claim 1 wherein each first heat exchanger of each fluid based cooling system is fixed to the corresponding heat generating device and a remaining portion of the fluid based cooling system is independent of the one or more circuit boards.

26. The cooling system of claim 1 wherein the thermal bus is segmented, each segment is coupled via fluid lines and each segment is distributed throughout the personal computer chassis.

27. A cooling system for cooling one or more heat generating devices within a personal computer, the cooling system comprising:
  a. a personal computer chassis;
  b. a primary heat exchanging system including a thermal bus and a first fluid passing therethrough, wherein the primary heat exchanging system is configured to receive a maximum thermal capacity, wherein the primary heat exchanging system is a closed system contained within the personal computer chassis and is configured to cool the first fluid therein;
  c. a scalable plurality of circuit boards removably mounted within the personal computer chassis, each circuit board including one or more heat generating devices that generate a thermal output, wherein a maximum number of circuit boards coupled to the primary heat exchanging system is determined according to the maximum thermal capacity of the primary heat exchanging system; and
  d. a scalable plurality of fluid based cooling systems, each fluid based cooling system includes at least one first heat exchanging device removably coupled to the thermal bus and at least one second heat exchanging device, wherein each fluid based cooling system is removably coupled to a corresponding one or more circuit boards such that each second heat exchanging device is removably coupled to one of the heat generating devices on the corresponding one or more circuit boards, further wherein each fluid based cooling system includes a second fluid passing therethrough wherein, the second fluid is configured to transfer the thermal output to the primary heat exchanging system.

28. The cooling system of claim 27 wherein each heat generating device on the removable circuit board is thermally coupled to one of the second heat exchanging devices.

29. The cooling system of claim 28 wherein the thermal bus is thermally coupled to each first heat exchanging device.

30. The cooling system of claim 29 wherein each fluid based cooling system includes the second fluid to receive heat transferred from each heat generating device of the corresponding one or more circuit boards via the second heat exchanging device.

31. The cooling system of claim 30 further comprising a thermal interface coupled to the thermal bus and each first heat exchanging device to transfer heat between the first fluid and the second fluid.

32. The cooling system of claim 27 wherein each fluid based cooling system comprises a pumped fluid loop.

33. The cooling system of claim 27 wherein each fluid based cooling system comprises a heat pipe.

34. The cooling system of claim 27 wherein one or more of the fluid based cooling systems comprises a pumped fluid loop and one or more of the fluid based cooling systems comprises a heat pipe.

35. The cooling system of claim 27 wherein at least one of the circuit boards comprises a mother board.

36. The cooling system of claim 27 further comprising a fixed circuit board mounting within the personal computer chassis and thermally coupled to one of the fluid based cooling systems.

37. The cooling system of claim 27 wherein one or more of the removable circuit boards comprises a graphics card, a physics processing card, or other accessory card that includes one or more heat generating devices.

38. The cooling system of claim 27 wherein the primary heat exchanging system forms a first closed fluid loop.

39. The cooling system of claim 38 wherein the primary heat exchanging system further comprises a first pump, wherein the first pump is included in the first closed fluid loop.

40. The cooling system of claim 39 wherein the primary heat exchanging system further comprises a fluid-to-air heat exchanging system, wherein the fluid-to-air heat exchanging system is included in the first closed fluid loop.

41. The cooling system of claim 27 wherein each fluid based cooling system forms a second closed fluid loop.

42. The cooling system of claim 41 wherein each fluid based cooling system further comprises a second pump, wherein the second pump is included in the second closed fluid loop.

43. The cooling system of claim 42 wherein the second pump is integrated with the first heat exchanging device.

44. The cooling system of claim 27 wherein the first fluid is physically isolated from the second fluid.

45. The cooling system of claim 27 wherein the thermal bus is configured with fluid channels through which the first fluid passes.

46. The cooling system of claim 45 wherein the fluid channels are configured in a parallel path relative to each other.

47. The cooling system of claim 45 wherein the fluid channels are configured in a serpentine path.

48. The cooling system of claim 27 wherein each second heat exchanging device is configured with micro-channels.

49. The cooling system of claim 27 wherein each first heat exchanging device includes a thermal interface geometry in contact with the thermal interface, the thermal interface geometry for each first heat exchanging device is independent of a thermal interface geometry of each other first heat exchanging device.

50. The cooling system of claim 49 wherein the thermal interface geometry of each specific first heat exchanging device is configured according to the thermal output generated by the one or more heat generating devices thermally coupled to the fluid based cooling system corresponding to the specific first heat exchanging device.

51. The cooling system of claim 27 wherein each specific first heat exchanging device includes a thermal interface geometry in contact with the thermal bus, the thermal interface geometry for each first heat exchanging device is scalable according to the thermal output generated by the one or more heat generating devices thermally coupled to the fluid based cooling system corresponding to the specific first heat exchanging device.

52. The cooling system of claim 27 wherein the primary heat exchanging system is configured in a fixed position within the personal computer chassis.

53. The cooling system of claim 52 wherein the first heat exchanger of each fluid based cooling system is fixed to the thermal bus and a remaining portion of the fluid based cooling system is configured so as to be flexibly positioned within the personal computer chassis.

54. The cooling system of claim 27 wherein the thermal bus is segmented, each segment is coupled via fluid lines and each segment is distributed throughout the personal computer chassis.

55. The cooling system of claim 27 further comprising a secondary heat exchanging system configured to remove thermal output from the one or more heat generating devices that exceed the maximum thermal capacity of the primary heat exchanging system.

\* \* \* \* \*

UNITED STATES PATENT AND TRADEMARK OFFICE
CERTIFICATE OF CORRECTION

PATENT NO. : 7,715,194 B2 Page 1 of 1
APPLICATION NO. : 11/784298
DATED : May 11, 2010
INVENTOR(S) : Richard Grant Brewer et al.

It is certified that error appears in the above-identified patent and that said Letters Patent is hereby corrected as shown below:

IN THE CLAIMS

At column 14, line 30, Claim 27, please add a comma after "therethrough" and remove the comma after "wherein" such that the phrase reads -- fluid passing therethrough, wherein the second fluid --.

Signed and Sealed this

Twenty-second Day of June, 2010

David J. Kappos
*Director of the United States Patent and Trademark Office*